United States Patent
Watanabe

(10) Patent No.: US 8,664,120 B2
(45) Date of Patent: Mar. 4, 2014

(54) SEMICONDUCTOR DEVICE MANUFACTURING METHOD

(75) Inventor: Shinya Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/593,063

(22) Filed: Aug. 23, 2012

(65) Prior Publication Data

US 2012/0315766 A1    Dec. 13, 2012

Related U.S. Application Data

(63) Continuation of application No. 12/126,098, filed on May 23, 2008, now Pat. No. 8,343,874.

(30) Foreign Application Priority Data

Jun. 1, 2007   (JP) ................................. 2007-147108

(51) Int. Cl.
*H01L 21/311* (2006.01)

(52) U.S. Cl.
USPC .................................. 438/696; 257/E21.257

(58) Field of Classification Search
None
See application file for complete search history.

(56) References Cited

U.S. PATENT DOCUMENTS

| | | |
|---|---|---|
| 5,323,048 A | 6/1994 | Onuma |
| 5,457,334 A | 10/1995 | Nishimoto |
| RE36,837 E | 8/2000 | Kohyama |
| 6,323,560 B1 | 11/2001 | Narimatsu et al. |
| 6,518,180 B1 | 2/2003 | Fukuda |
| 6,586,329 B1 | 7/2003 | Tanaka et al. |
| 6,642,114 B2 | 11/2003 | Nakamura |
| 6,720,612 B2 | 4/2004 | Takeuchi et al. |
| 6,740,924 B2 | 5/2004 | Ichise et al. |
| 6,873,720 B2 * | 3/2005 | Cai et al. ........................ 382/149 |
| 6,993,455 B2 * | 1/2006 | Koehle et al. .................. 702/182 |
| 7,266,800 B2 * | 9/2007 | Sezginer .......................... 716/52 |
| 7,488,644 B2 | 2/2009 | Lee et al. |
| 7,709,367 B2 | 5/2010 | Lee et al. |
| 8,004,057 B2 | 8/2011 | Tian et al. |
| 2002/0048886 A1 | 4/2002 | Nakamura |
| 2002/0088951 A1 * | 7/2002 | Chen ............................. 250/548 |

(Continued)

FOREIGN PATENT DOCUMENTS

| | | |
|---|---|---|
| JP | 2000-294502 | 10/2000 |
| JP | 2003-249437 | 9/2003 |

(Continued)

OTHER PUBLICATIONS

Notice of Reasons for Rejection mailed on Aug. 11, 2009, by the Japanese Patent Office in copending Application No. 2007-147108 and English language translation thereof.

*Primary Examiner* — Allan Olsen
(74) *Attorney, Agent, or Firm* — Finnegan, Henderson, Farabow, Garrett & Dunner, LLP

(57) ABSTRACT

In a semiconductor device manufacturing method, on a film to be processed, a mask material film is formed which has pattern openings for a plurality of contact patterns and connection openings for connecting adjacent pattern openings in such a manner that the connection between them is constricted in the middle. Then, a sidewall film is formed on the sidewalls of the individual openings in the mask material film, thereby not only making the diameter of the pattern openings smaller but also separating adjacent pattern openings. Then, the film to be processed is selectively etched with the mask material film and sidewall film as a mask, thereby making contact holes.

16 Claims, 9 Drawing Sheets

(56) References Cited

U.S. PATENT DOCUMENTS

| | | | |
|---|---|---|---|
| 2003/0098970 A1* | 5/2003 | Chen | 356/124 |
| 2003/0111668 A1 | 6/2003 | Watanabe et al. | |
| 2004/0188806 A1 | 9/2004 | Chung et al. | |
| 2005/0088895 A1* | 4/2005 | Manger et al. | 365/222 |
| 2006/0202341 A1* | 9/2006 | Ito | 257/758 |
| 2006/0261392 A1 | 11/2006 | Lee et al. | |
| 2007/0045808 A1 | 3/2007 | Farnworth et al. | |
| 2007/0134865 A1 | 6/2007 | Shukuri | |
| 2007/0218682 A1 | 9/2007 | Lee et al. | |
| 2007/0293041 A1 | 12/2007 | Yang et al. | |
| 2008/0093743 A1 | 4/2008 | Yang et al. | |
| 2008/0096384 A1* | 4/2008 | Anderson et al. | 438/653 |
| 2008/0280232 A1* | 11/2008 | Kim | 430/313 |
| 2009/0221148 A1* | 9/2009 | Uda et al. | 438/696 |
| 2010/0171167 A1* | 7/2010 | Liu et al. | 257/316 |
| 2010/0330793 A1 | 12/2010 | Kim | |
| 2011/0140073 A1 | 6/2011 | Eden et al. | |
| 2011/0207328 A1 | 8/2011 | Speakman | |
| 2011/0297912 A1 | 12/2011 | Samachisa et al. | |
| 2011/0312169 A1* | 12/2011 | Kurjanowicz et al. | 438/585 |
| 2013/0140623 A1* | 6/2013 | Lee et al. | 257/324 |

FOREIGN PATENT DOCUMENTS

| | | |
|---|---|---|
| JP | 2005-150222 | 6/2005 |
| JP | 2005-181379 | 7/2005 |
| JP | 2006-276865 | 10/2006 |

* cited by examiner

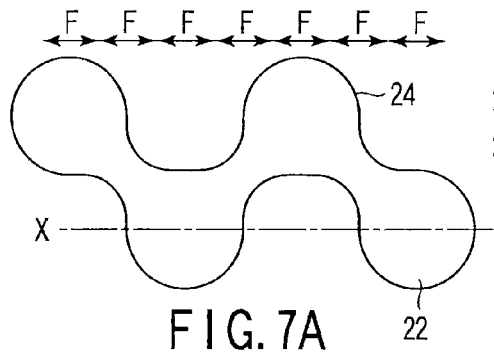 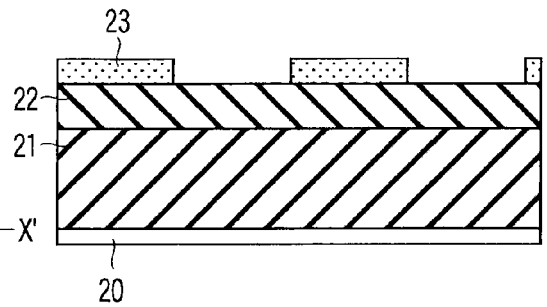
FIG. 7A  FIG. 7B
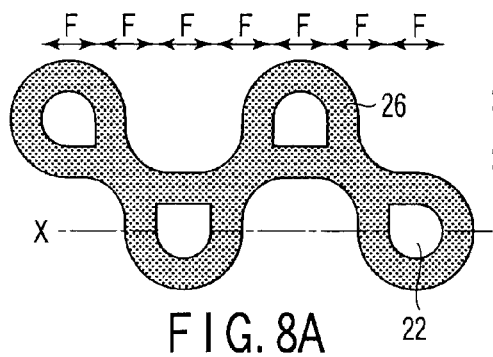 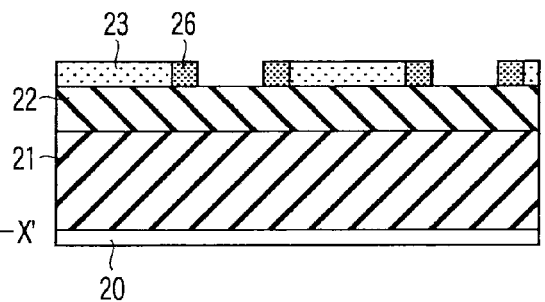
FIG. 8A  FIG. 8B
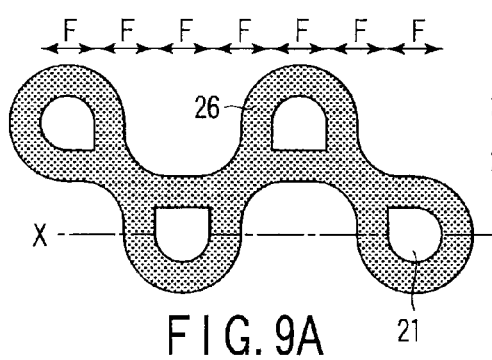 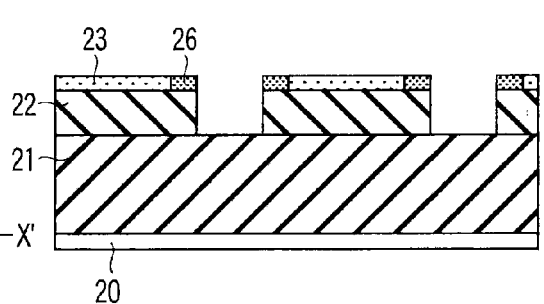
FIG. 9A  FIG. 9B
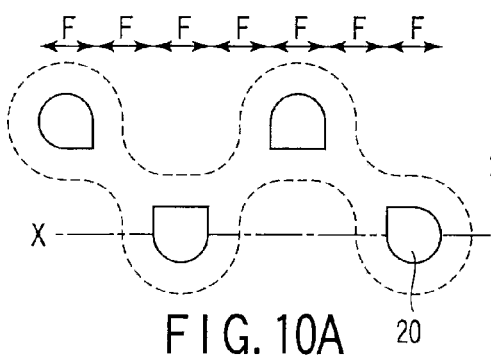 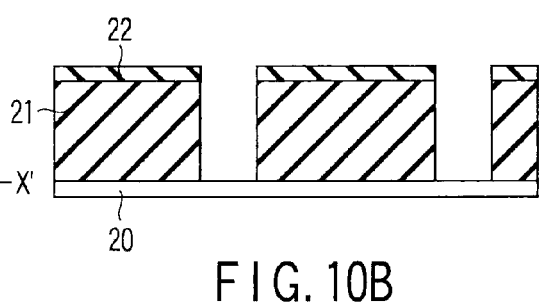
FIG. 10A  FIG. 10B

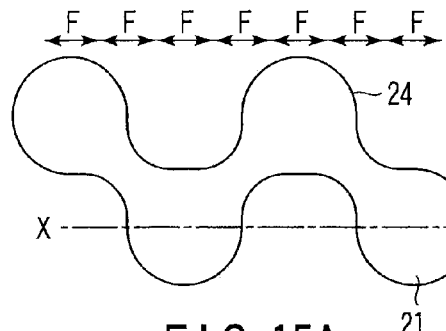 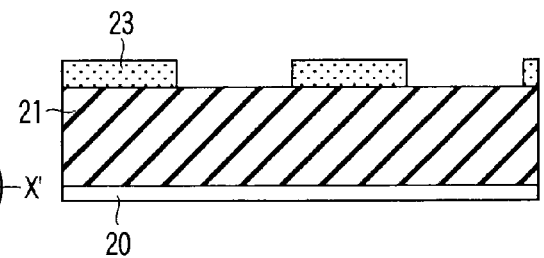
FIG. 15A  FIG. 15B
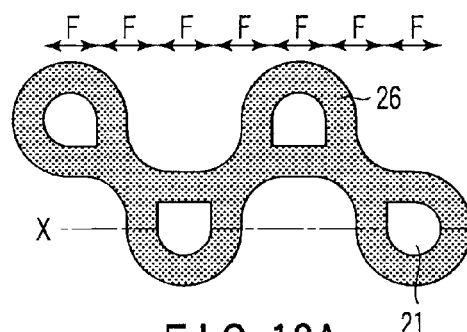 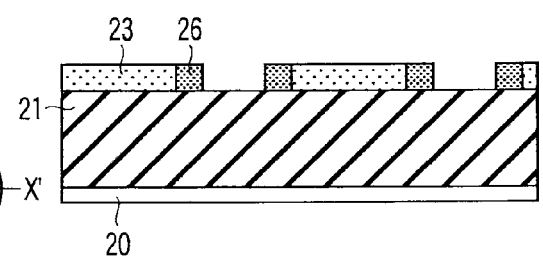
FIG. 16A  FIG. 16B
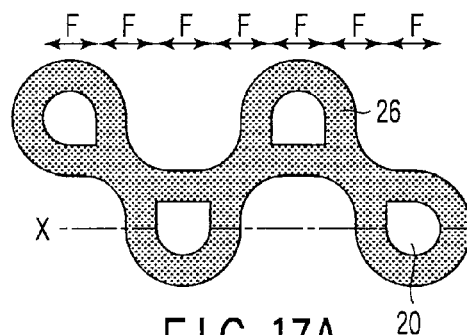 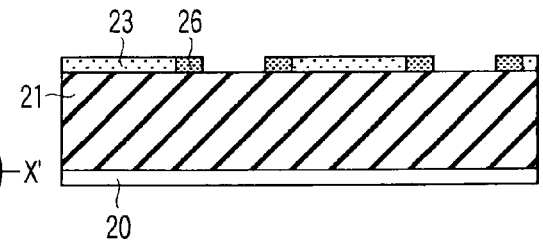
FIG. 17A  FIG. 17B

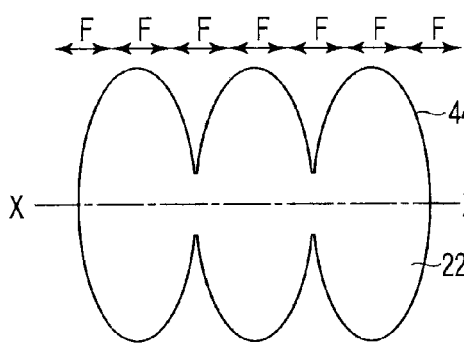 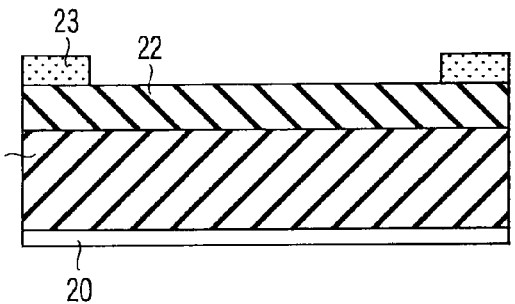
FIG. 18A  FIG. 18B
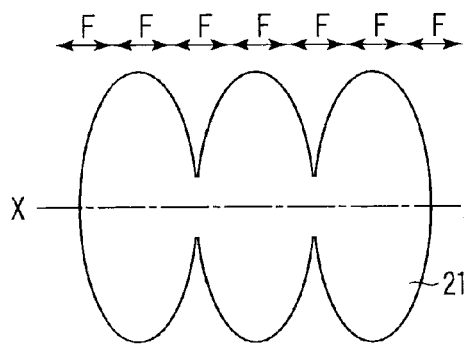 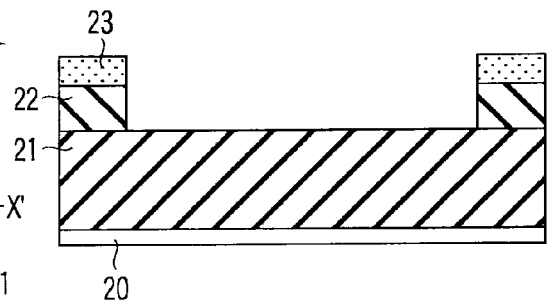
FIG. 19A  FIG. 19B
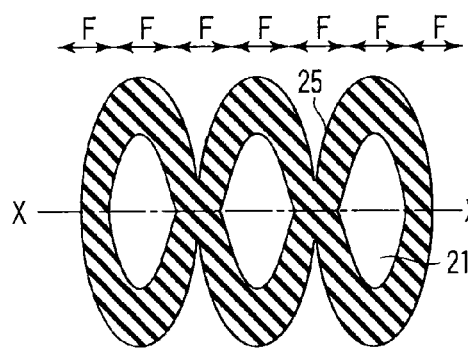 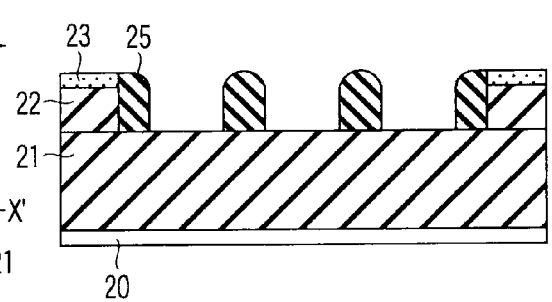
FIG. 20A  FIG. 20B
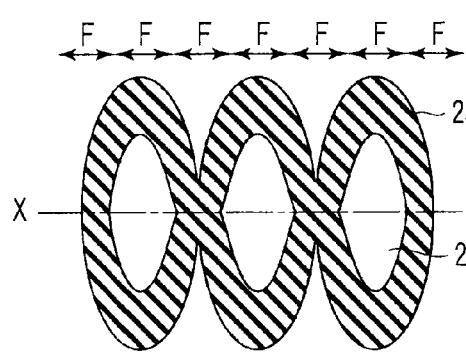 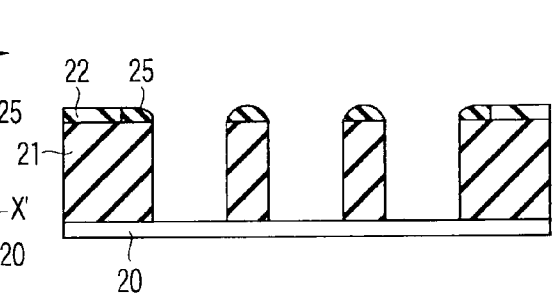
FIG. 21A  FIG. 21B

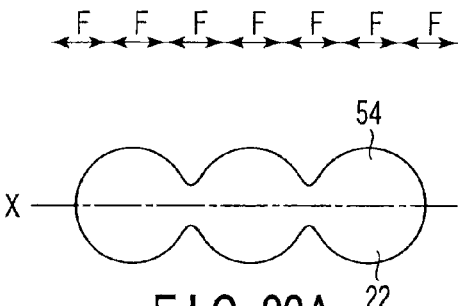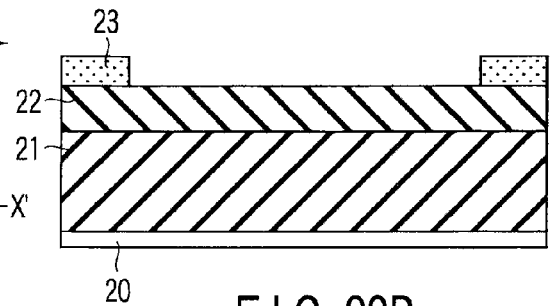
FIG. 22A  FIG. 22B
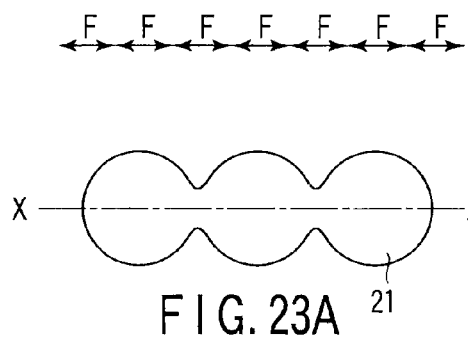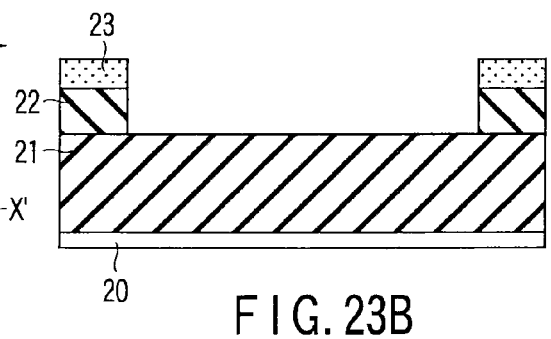
FIG. 23A  FIG. 23B
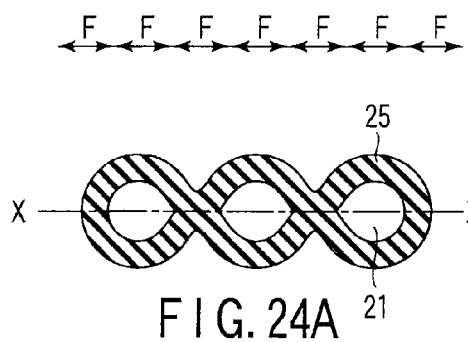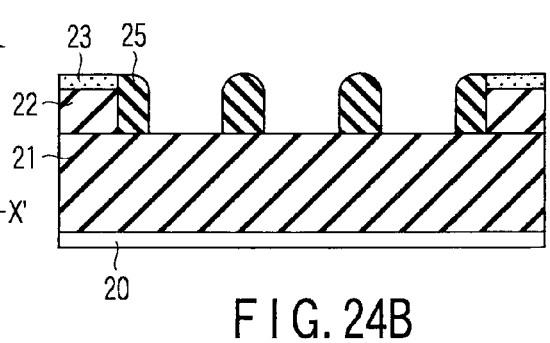
FIG. 24A  FIG. 24B
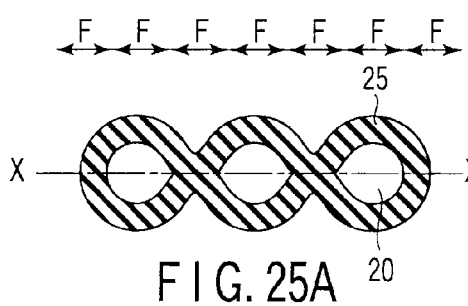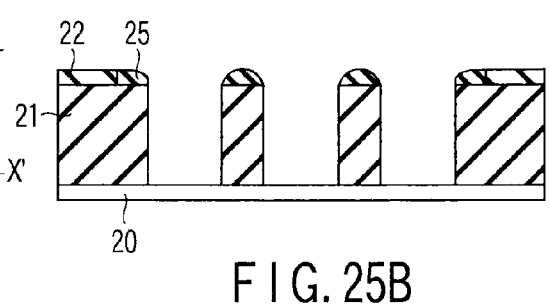
FIG. 25A  FIG. 25B

SEMICONDUCTOR DEVICE MANUFACTURING METHOD

CROSS-REFERENCE TO RELATED APPLICATIONS

This is a continuation of U.S. application Ser. No. 12/126,098, filed May 23, 2008 now U.S. Pat. No. 8,343,874 which claims the benefit of priority from Japanese Patent Application No. 2007-147108, filed Jun. 1, 2007, the entire contents of all of which are incorporated herein by reference.

BACKGROUND OF THE INVENTION

1. Field of the Invention

This invention relates to a semiconductor device manufacturing method comprising a step of making contact holes in a film to be processed, and more particularly to a semiconductor device manufacturing method which has improved a step of making small-diameter contact holes.

2. Description of the Related Art

With the recent miniaturization of LSI patterns, the diameter of contact holes is getting smaller and smaller and the pitch between contact holes is also becoming narrower. To form a pattern with such contact holes (or a contact pattern), an ultrahigh-resolution exposure device has to be used, which is a factor that increases the pattern forming cost.

To overcome this problem, the following method has recently been proposed: contact holes whose diameter is larger than the proper one are formed using an exposure device whose resolution is not high and then a pattern thickening material, etc. are formed on the sidewalls of the contact holes (e.g., refer to Jpn. Pat. Appln. KOKAI Publication No. 2006-276865).

With this method, however, since the distance between adjacent contact patterns becomes shorter, adjacent contact patterns short-circuit, which is a problem. To prevent short-circuits, there is a method of arranging contact patterns in a zigzag. In this case, the element area increases.

As described above, when an attempt is made to form very small contact patterns with a narrow pitch periodically, an ultrahigh-resolution exposure device (generally a high numerical aperture NA) is needed, which causes the problem of increasing the pattern forming cost. Moreover, in a method which needs no high-resolution exposure device by devising means of arranging contact patterns, the chip area increases, which is a problem.

BRIEF SUMMARY OF THE INVENTION

According to an aspect of the invention, there is provided a semiconductor device manufacturing method comprising: forming on a film to be processed a mask material film which has pattern openings for a plurality of contact patterns and connection openings to connect adjacent pattern openings; forming a sidewall film on the sidewalls of the individual openings in the mask material film not only to make the diameter of the pattern openings smaller but also to separate adjacent pattern openings; and making contact holes by selectively etching the film to be processed with the mask material film and sidewall film as a mask.

According to another aspect of the invention, there is provided a semiconductor device manufacturing method comprising: forming a mask thin film on a film to be processed; forming a resist film on the mask thin film; exposing the resist film in such a manner that a plurality of contact patterns are arranged close to the resist film, thereby forming a resist pattern where adjacent contact patterns are connected in such a manner that the connection between them is constricted in the middle; selectively etching the mask thin film with the resist pattern as a mask, thereby making, in the mask thin film, pattern openings corresponding to the contact patterns and connection openings for connecting adjacent pattern openings; forming a spacer film on the sidewalls of the individual openings in the mask thin film, thereby not only making the diameter of the pattern openings smaller and separating the adjacent pattern openings; and selectively etching the film to be processed with the mask thin film and spacer film as a mask, thereby making contact holes.

According to another aspect of the invention, there is provided a semiconductor device manufacturing method comprising: forming a mask thin film on a film to be processed; forming a resist film on the mask thin film; exposing the resist film in such a manner that a plurality of contact patterns are arranged close to the resist film, thereby forming a resist pattern where adjacent contact patterns are connected in such a manner that the connection between them is constricted in the middle; forming an auxiliary resist film on the sidewalls of the openings in the resist pattern, thereby not only making smaller the diameter of the pattern openings corresponding to the contact patterns but also separating adjacent pattern openings; selectively etching the mask thin film using the resist film and auxiliary resist film as a mask; and making contact holes by selectively etching the film to be processed using the mask thin film as a mask.

BRIEF DESCRIPTION OF THE SEVERAL VIEWS OF THE DRAWING

FIGS. 7A and 7B are a plan view and a sectional view to help explain a contact hole making step according to a second embodiment of the invention;

FIGS. 8A and 8B are a plan view and a sectional view to help explain a contact hole making step according to the second embodiment;

FIGS. 9A and 9B are a plan view and a sectional view to help explain a contact hole making step according to the second embodiment;

FIGS. 10A and 10B are a plan view and a sectional view to help explain a contact hole making step according to the second embodiment;

FIGS. 15A and 15B are a plan view and a sectional view to help explain a contact hole making step according to a fourth embodiment of the invention;

FIGS. 16A and 16B are a plan view and a sectional view to help explain a contact hole making step according to the fourth embodiment;

FIGS. 17A and 17B are a plan view and a sectional view to help explain a contact hole making step according to the fourth embodiment;

FIGS. 18A and 18B are a plan view and a sectional view to help explain a contact hole making step according to a fifth embodiment of the invention;

FIGS. 19A and 19B are a plan view and a sectional view to help explain a contact hole making step according to the fifth embodiment;

FIGS. 20A and 20B are a plan view and a sectional view to help explain a contact hole making step according to the fifth embodiment;

FIGS. 21A and 21B are a plan view and a sectional view to help explain a contact hole making step according to the fifth embodiment;

FIGS. 22A and 22B are a plan view and a sectional view to help explain a contact hole making step according to a sixth embodiment of the invention;

FIGS. 23A and 23B are a plan view and a sectional view to help explain a contact hole making step according to the sixth embodiment;

FIGS. 24A and 24B are a plan view and a sectional view to help explain a contact hole making step according to the sixth embodiment;

FIGS. 25A and 25B are a plan view and a sectional view to help explain a contact hole making step according to the sixth embodiment.

DETAILED DESCRIPTION OF THE INVENTION

Before the explanation of embodiments of the invention, the basic idea of the invention will be explained.

Figure 1A:
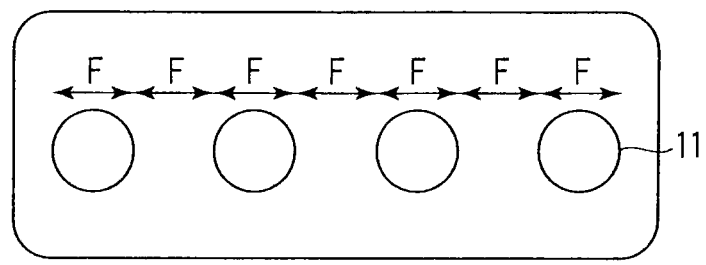
FIGS. 1A to 1D are pattern diagrams to help explain the basic idea of the invention.

As shown in FIG. 1A, suppose the minimum pitch of patterns is F (e.g., 32 nm) and a contact pattern 11 whose diameter is F is arranged with a pitch of 2F. To realize such a shape, a high-resolution exposure device with a large NA is needed, which increases the pattern forming cost.

Figure 1B:
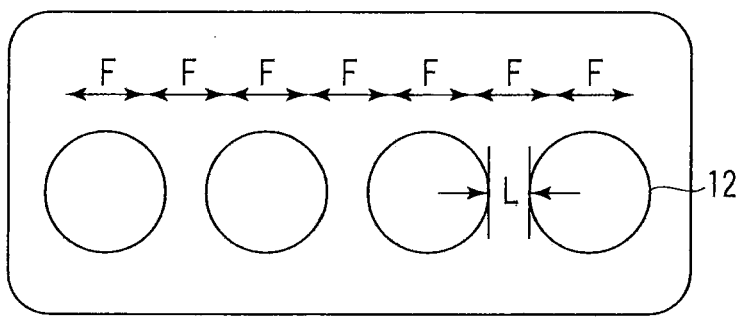

A method of reducing the pattern forming cost is as follows: with a not-so-high-resolution exposure device, a resist is exposed using isolated contact patterns 12 whose diameter is large, as shown in FIG. 1B. Then, after the resist is developed, the developed resist or the sidewall of the mask material etched on the basis of the resist is processed by sidewall leaving techniques, which eventually makes the contact diameter smaller. With this method, however, since the larger-diameter pattern is exposed, the distance L (L<F) between adjacent patterns becomes shorter and therefore there is a possibility that the adjacent contact patterns 12 may short-circuit.

Figure 1C:
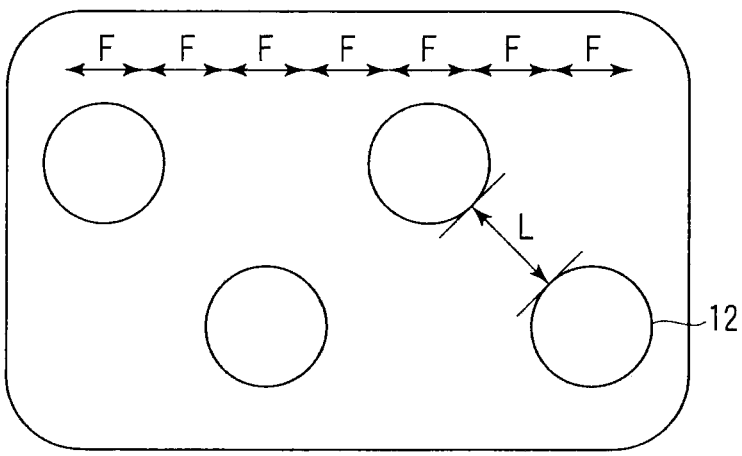
Figure 1D:
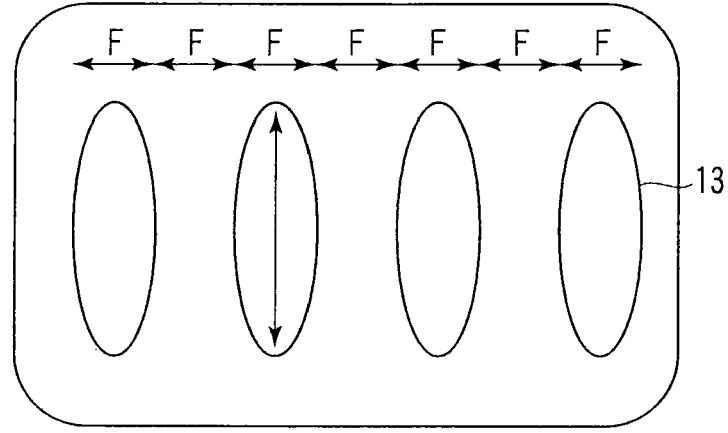

To take measures against short circuits, there is a method of widening the space L between adjacent contacts by arranging the contact patterns 12 in a zigzag as shown in FIG. 1C. Moreover, there is a method of relaxing the design in the longitudinal direction using elliptical contact patterns 13 as shown in FIG. 1D. However, these measures cause the problem of increasing the chip size.

To overcome this problem, the embodiments of the invention make positive use of short circuits instead of preventing adjacent contacts from short-circuiting, thereby making a high-performance exposure device unnecessary and reducing the chip size. Since there is no need to worry about short circuits during exposure, the space L of FIG. 1C can be made still narrower. The design in the longitudinal direction of FIG. 1D also need not be relaxed, which enables the chip area to be made still smaller.

Hereinafter, referring the accompanying drawings, embodiments of the invention will be explained in detail.

First Embodiment

FIGS. 2A and 2B to FIGS. 5A and 5B are diagrams to help explain semiconductor device manufacturing steps according to a first embodiment of the invention, particularly contact hole making steps. FIG. 2A to FIG. 5A are plan views and FIG. 2B to FIG. 5B are sectional views taken along line X-X' of FIG. 2A to FIG. 5A.

Figure 2A:
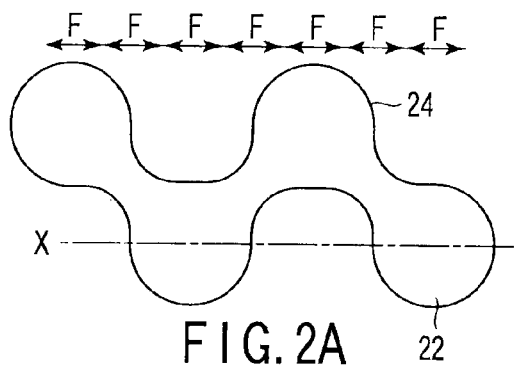
FIGS. 2A and 2B are a plan view and a sectional view to help explain a contact hole making step according to a first embodiment of the invention.
Figure 2B:
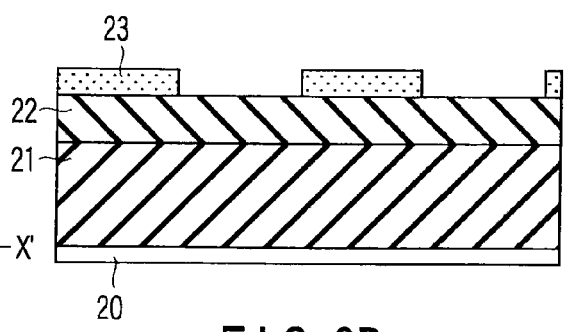

First, as shown in FIGS. 2A and 2B, on an interlayer insulating film (a film to be processed) 21, such as an oxide film, formed on an underlaying substrate 20, such as Si, on which elements have been formed, a mask thin film (a first mask material film) 22 made of SiN or the like and a resist film (a second mask material film) 23 are formed sequentially in that order. The interlayer insulating film 21 is not necessarily composed of an oxide film and may be made of TEOS, SiN, BPSG, or a stacked film of these materials. The mask thin film 22 is not necessarily made of SiN and may be made of TEOS, polycrystalline Si or a stacked film of these materials. However, the mask thin film 22 has to be composed of a material (a material with a high etching selection ratio) differing from that of the interlayer insulating film 21. The resist film 23 has only to be photosensitive to light from the exposure device used.

Then, with the exposure device, the resist film 23 is exposed using the zigzag-arranged contact patterns 24, followed by the necessary development process. Various types of exposure device may be used. An exposure device with a low resolution as compared with patterns to be finally formed may be used. For example, a KrF excimer laser exposure device or immersion exposure device may be used. At this time, exposure is made so as to short-circuit the corners of adjacent contacts, thereby forming a resist pattern 24 where adjacent contacts are connected in such a manner that the connection between them is constricted in the middle. Moreover, to make exposure to short-circuit adjacent contacts, the lighting condition for the exposure device is adjusted.

Figure 6A:
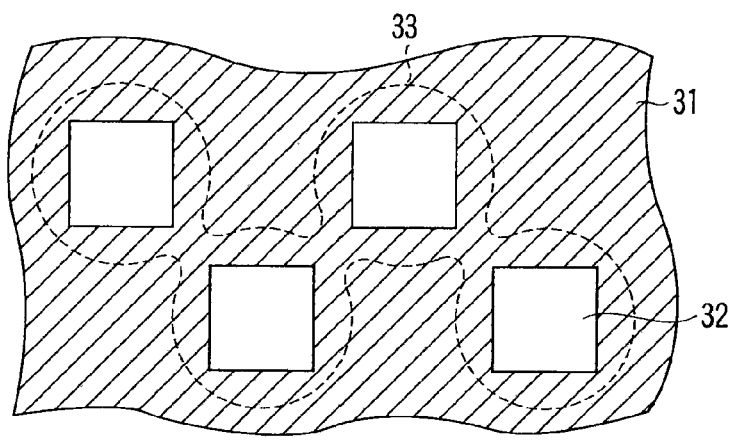
FIGS. 6A to 6D are plan views showings examples of a mask pattern used in a first to a sixth embodiment of the invention.
Figure 6B:
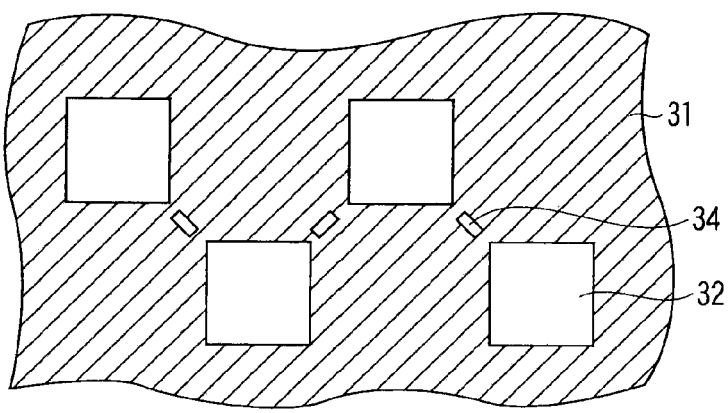

In a mask used in exposing contacts, rectangular openings are arranged in a zigzag as shown in FIG. 6A. In FIG. 6A, numeral 31 indicates the light blocking part of the mask and 32 a rectangular pattern acting as a light passing part (opening) of the mask. When exposure is made using the mask, the part closest to adjacent openings is exposed through both openings, with the result that the adjacent openings are connected in such a manner that the connection between them is constricted in the middle, as shown by a broken line 33 in FIG. 6A. To connect adjacent openings reliably, microscopic auxiliary patterns (SRAF) 34 of a width less than a resolution limit may be provided between adjacent openings as shown in FIG. 6B.

Figure 3A:
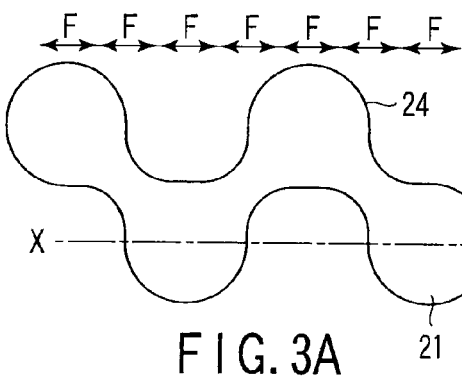
FIGS. 3A and 3B are a plan view and a sectional view to help explain a contact hole making step according to the first embodiment.
Figure 3B:
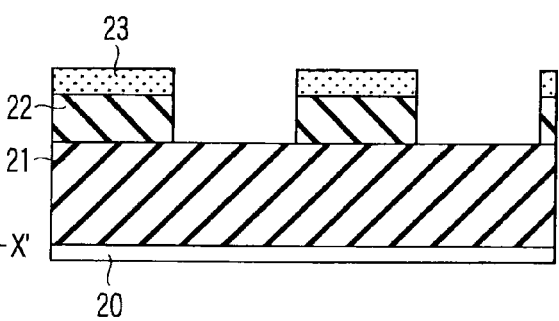

Next, as shown in FIGS. 3A and 3B, with the resist film 23 as a mask, the mask thin film 22 is selectively etched by RIE (reactive ion etching) techniques. As a result, not only are pattern openings corresponding to the contact patterns made in the mask thin film 22, but also connection openings are made in such a manner that the connection between adjacent pattern openings is constricted in the middle.

Figure 4A:
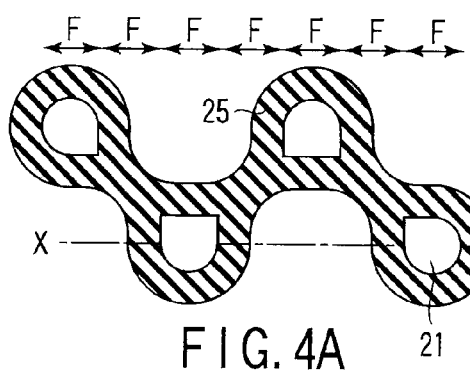
FIGS. 4A and 4B are a plan view and a sectional view to help explain a contact hole making step according to the first embodiment.
Figure 4B:
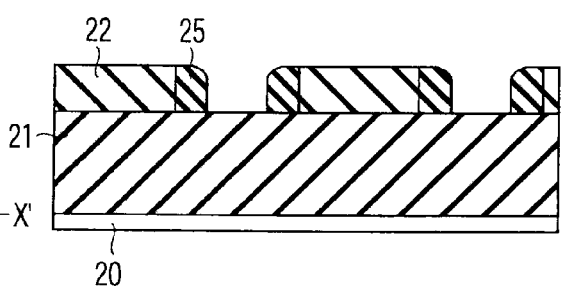

Then, as shown in FIGS. 4A and 4B, on the sidewalls of the openings in the mask thin film 22, a spacer film 25 made of, for example, TEOS, SiN, BSG, or polycrystalline Si, is formed. Specifically, after a spacer film 25 is formed on the mask thin film 22 and in the openings by CVD techniques or the like, the entire surface of the spacer film 25 is etched by RIE techniques or the like until the surface of the mask thin film 22 is exposed. As a result, the spacer 25 remains only on the sidewall of the mask thin film 22. That is, the spacer film 25 can be formed on the sidewall of the mask thin film 22 in a self-aligning manner. The formation of the spacer film 25 not only makes the diameter of the pattern openings smaller but also separates the adjacent pattern openings by filling the connection openings with the spacer film 25.

In this case, as a result of the formation of the spacer film 25, the connection part between adjacent openings has to be completely filled with the spacer film 25, thereby separating the adjacent openings. To do this, the film thickness of the spacer film 25 has to be made equal to or larger than S, if the minimum width of the connection part between adjacent openings is 2S.

Figure 5A:
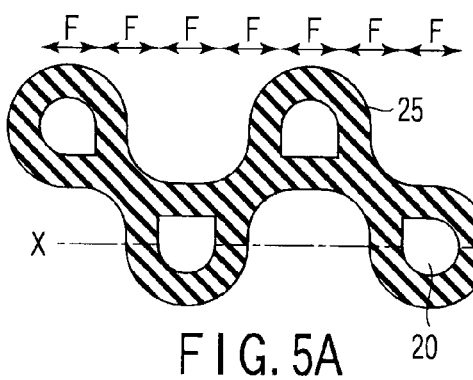
FIGS. 5A and 5B are a plan view and a sectional view to help explain a contact hole making step according to the first embodiment.
Figure 5B:
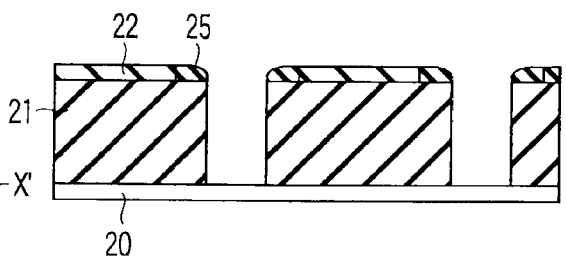

Next, as shown in FIGS. 5A and 5B, using the mask thin film 22 and spacer film 25 as a mask, the interlayer insulating film 21 is selectively etched by RIE techniques. As a result, microscopic contact holes are made.

As described above, with the first embodiment, the space between contacts which was widened to prevent short circuits during exposure until now can be made narrower by making positive use of short circuits instead of preventing adjacent contacts from short-circuiting. This makes it possible to reduce the chip size. If the ship size is the same, the design of contacts which was made as small as possible until now can be made larger so as to short-circuit the contacts during exposure. Accordingly, a high-performance NA exposure device is not needed and therefore the product cost can be suppressed.

Specifically, when the first embodiment is compared with the example of FIG. 1C, the following effect is obtained. In the example of FIG. 1C, to prevent adjacent contacts from short-circuiting, the space L almost as large as the pattern minimum pitch F has to be provided between the contacts. In contrast, with the first embodiment, since adjacent contacts are positively short-circuited, the space L can be made shorter than F. Accordingly, adjacent contacts can be brought nearer each other, which enables the chip area to be reduced.

That is, even if the same exposure device is used, the space L between contacts can be reduced and therefore the chip area can be decreased. Moreover, if the chip area remains unchanged with a pattern arrangement with the same space L between contacts, an exposure device with a still lower resolution can be used, which makes it possible to reduce the pattern forming cost.

Second Embodiment

FIGS. 7A and 7B to FIGS. 10A and 10B are diagrams to help explain semiconductor device manufacturing steps according to a second embodiment of the invention, particularly contact hole making steps. FIG. 7A to FIG. 10A are plan views and FIG. 7B to FIG. 10B are sectional views taken along line X-X' of FIG. 7A to FIG. 10A. The same parts as those in FIGS. 2A and 2B to FIGS. 5A and 5B are indicated by the same reference numerals and a detailed explanation of them will be omitted.

The second embodiment differs from the first embodiment in that an organic auxiliary resist film is formed on the sidewalls of the openings in the resist film instead of forming the spacer film on the sidewalls of the openings in the mask thin film.

First, as shown in FIGS. 7A and 7B, the resist film 23 is exposed using zigzag-arranged contact patterns as in the first embodiment. At this time, exposure is made so as to short-circuit the corners of adjacent contacts, thereby forming a resist pattern 24 with the adjacent contacts connected in such a manner that the connection between them is constricted in the middle.

Then, as shown in FIGS. 8A and 8B, an organic resist auxiliary film 26 is formed on the sidewalls of the openings in the resist film 23 in a self-aligning manner. As a method of forming the resist auxiliary film 26, a so-called RELACS method may be used. In the RELACS method, after a special processing auxiliary material is applied to the surface of the resist film 23, the film is heat-treated. As the result of the heat treatment, the acid in the resist film 23 diffuses and cross-linking reacts with the processing auxiliary material, thereby forming a thermoset resin layer (resist auxiliary film 26) on the inside of the original pattern.

The formation of the resist auxiliary film 26 not only makes the diameter of the pattern openings smaller but also separates the adjacent pattern openings by filling the connection openings with the resist auxiliary film 26.

Then, as shown in FIGS. 9A and 9B, with the resist film 23 and resist auxiliary film 26 as a mask, the mask thin film 22 is selectively etched by RIE techniques. At this time, the openings in the mask thin film 22 are made in an already-separated manner.

Next, as shown in FIGS. 10A and 10B, with the mask thin film 22 as a mask, the interlayer insulating film 21 is selectively etched by RIE techniques, thereby making microscopic contact holes.

As described above, with the second embodiment, after the resist film 23 is exposed using contact patterns in such a manner that adjacent patterns are connected, the auxiliary resist film 26 is formed on the sidewalls of the openings in the resist film 23, thereby making microscopic holes with a narrow pitch. Accordingly, the same effect as that of the first embodiment is obtained. Moreover, since the auxiliary resist film 26 is formed on the sidewalls of the openings in the resist film 23 instead of forming the spacer film 25 on the sidewalls of the openings in the mask thin film 22, the formation of a deposited film by CVD techniques and the step of etching the entire surface by RIE techniques are not needed, which provides the advantage of simplifying the processes.

Third Embodiment

FIGS. 11A and 11B to FIGS. 14A and 14B are diagrams to help explain semiconductor device manufacturing steps according to a third embodiment of the invention, particularly contact hole making steps. FIG. 11A to FIG. 14A are plan views and FIG. 11B to FIG. 14B are sectional views taken along line X-X' of FIG. 11A to FIG. 14A. The same parts as those in FIGS. 2A and 2B to FIGS. 5A and 5B are indicated by the same reference numerals and a detailed explanation of them will be omitted.

The third embodiment is a combination of the first and second embodiments explained above. That is, the third embodiment is a method of using the spacer film 25 and resist auxiliary film 26.

First, as in the first and second embodiments, the resist film 23 is exposed using contact patterns arranged in a zigzag. At this time, exposure is made so as to short-circuit the corners of adjacent contacts, thereby forming a resist pattern 24 with the adjacent patterns connected in such a manner that the connection between them is constricted in the middle.

Figure 11A:
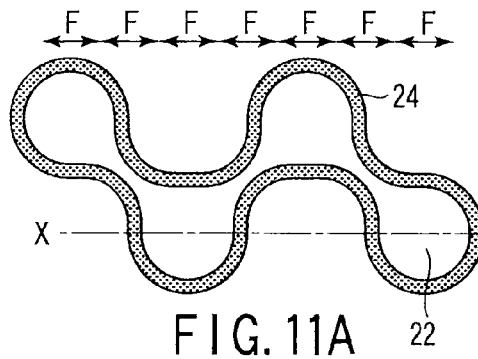
FIGS. 11A and 11B are a plan view and a sectional view to help explain a contact hole making step according to a third embodiment of the invention.
Figure 11B:
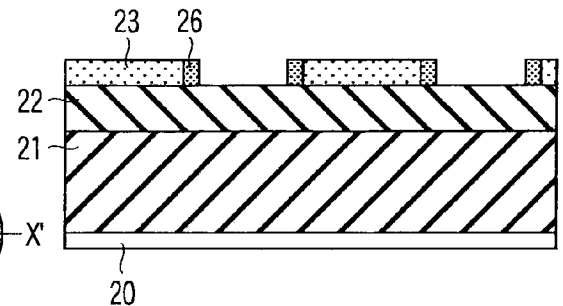

Then, as shown in FIGS. 11A and 11B, the auxiliary resist film 26 is formed on the sidewalls of the openings in the resist film 23 in a self-aligning manner by the method explained in the second embodiment. At this time, the adjacent openings are connected with a reduced distance between the openings instead of the connection part of the adjacent contacts being filled completely with the resist auxiliary film 26.

Figure 12A:
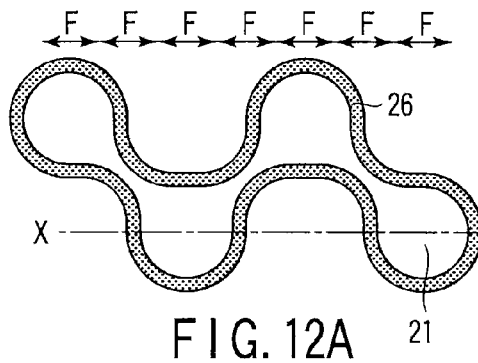
FIGS. 12A and 12B are a plan view and a sectional view to help explain a contact hole making step according to the third embodiment.
Figure 12B:
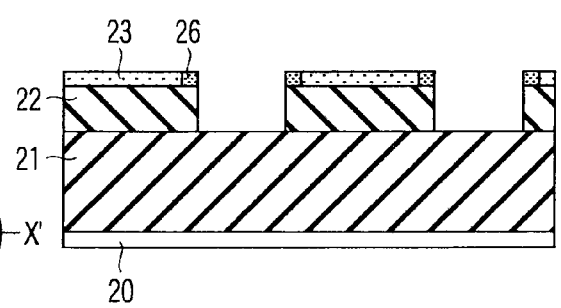

Next, as shown in FIGS. 12A and 12B, using the resist film 23 and resist auxiliary film 26 as a mask, the mask thin film 22 is selectively etched by RIE techniques. As a result, not only are pattern openings corresponding to the contact patterns made in the mask thin film 22, but also connection openings are made which connect the adjacent openings in such a manner that the connection between them is constricted in the middle.

Figure 13A:
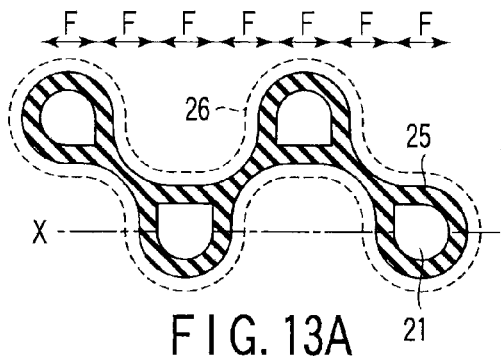
FIGS. 13A and 13B are a plan view and a sectional view to help explain a contact hole making step according to the third embodiment.
Figure 13B:
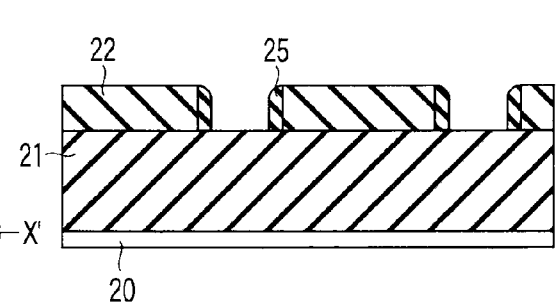

Then, as shown in FIGS. 13A and 13B, a spacer film 25 is formed on the sidewalls of the openings in the mask thin film 22 using the sidewall leaving technique explained in the first embodiment. As a result, not only is the diameter of the pattern openings in the mask thin film 22 made smaller, but also the adjacent pattern openings are separated since the connection parts of the openings are filled with the spacer film 25.

Figure 14A:
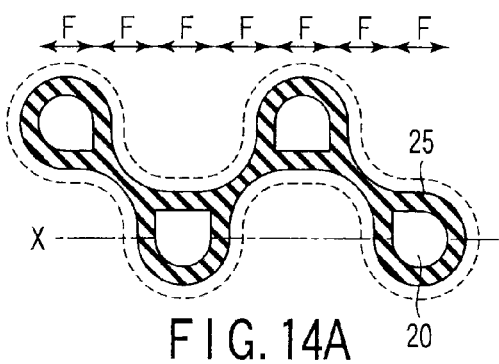
FIGS. 14A and 14B are a plan view and a sectional view to help explain a contact hole making step according to the third embodiment.
Figure 14B:
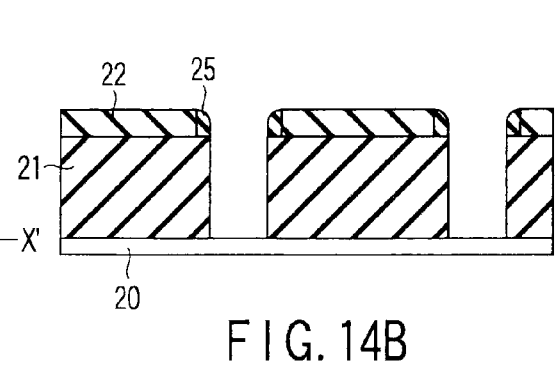

Next, as shown in FIGS. 14A and 14B, with the mask thin film 22 and spacer film 25 as a mask, the interlayer insulating film 21 is selectively etched by RIE techniques, thereby making microscopic contact holes.

Even by the above steps, microscopic contact holes can be made with a narrow pitch as in the first and second embodiments. In this case, since the connection openings for connecting pattern openings are filled with the resist auxiliary film 26 and spacer film 25, even if the width of the connection opening is relatively large, the pattern openings can be separated reliably by filling the connection openings with those films.

Fourth Embodiment

FIGS. 15A and 15B to FIGS. 17A and 17B are diagrams to help explain semiconductor device manufacturing steps according to a fourth embodiment of the invention, particularly contact hole making steps. FIG. 15A to FIG. 17A are plan views and FIG. 15B to FIG. 17B are sectional views taken along line X-X' of FIG. 15A to FIG. 17A. The same parts as those in FIGS. 7A and 7B to FIGS. 10A and 10B are indicated by the same reference numerals and a detailed explanation of them will be omitted.

The fourth embodiment differs from the second embodiment in that the mask thin film 22, such as a nitride film, is eliminated.

Specifically, in the fourth embodiment, as shown in FIGS. 15A and 15B, the resist film 23 as a mask material film is formed on the interlayer insulating film 21 without forming the mask thin film 22 on the interlayer insulting film 21. The resist film 23 is exposed using zigzag-arranged contact patterns as in the first to third embodiments.

Then, as shown in FIGS. 16A and 16B, a resist auxiliary film (sidewall film) 26 is formed on the sidewalls of the openings in the resist film 23 by the RELACS method explained in the second embodiment. As a result, not only is the diameter of the pattern openings made smaller, but also the connection openings are filled with the resist auxiliary film 26, thereby separating the adjacent pattern openings.

Next, as shown in FIGS. 17A and 17B, using the resist film 23 and resist auxiliary film 26 as a mask, the interlayer insulating film 21 is selectively etched by RIE techniques, thereby making contact holes.

As described above, with the fourth embodiment, if the organic films, including the resist film 23 and resist auxiliary film 26, and the interlayer insulating film 21, such as an oxide film, can be etched in a sufficient selection ratio, the mask thin film 22 can be omitted. Accordingly, not only is the same effect as that of the first embodiment obtained, but also the processes can be simplified.

The idea of omitting the mask thin film 22 may be applied not only to the second embodiment but also to the third embodiment. Specifically, instead of forming the resist auxiliary film 26 by the RELACS method, the spacer film 25 is formed on the sidewalls of the openings in the resist film 23 by the sidewall leaving technique. More specifically, after a spacer film (sidewall film), such as an oxide film or a nitride film formed at low temperatures, is formed on the substrate on which the resist pattern 24 has been formed, the spacer film is left only on the sidewalls of the openings in the resist film 23 by etching back techniques.

Fifth Embodiment

FIGS. 18A and 18B to FIGS. 21A and 21B are diagrams to help explain semiconductor device manufacturing steps according to a fifth embodiment of the invention, particularly contact hole making steps. FIG. 18A to FIG. 21A are plan views and FIG. 18B to FIG. 21B are sectional views taken along line X-X' of FIG. 18A to FIG. 21A. The same parts as those in FIGS. 2A and 23 to FIGS. 5A and 5B are indicated by the same reference numerals and a detailed explanation of them will be omitted.

The fifth embodiment differs from the first embodiment in that elliptical contacts are arranged in one direction instead of arranging circular contacts in a zigzag.

As shown in FIGS. 18A and 18B, the resist film 23 is exposed using elliptical contact patterns which are arranged in one direction and whose long axes are aligned in a direction perpendicular to the one direction. At this time, exposure is made so as to short-circuit the corners of adjacent contacts, thereby forming a resist pattern 44 where the adjacent contacts are connected in such a manner that the connection between them is constricted in the middle.

Figure 6C:
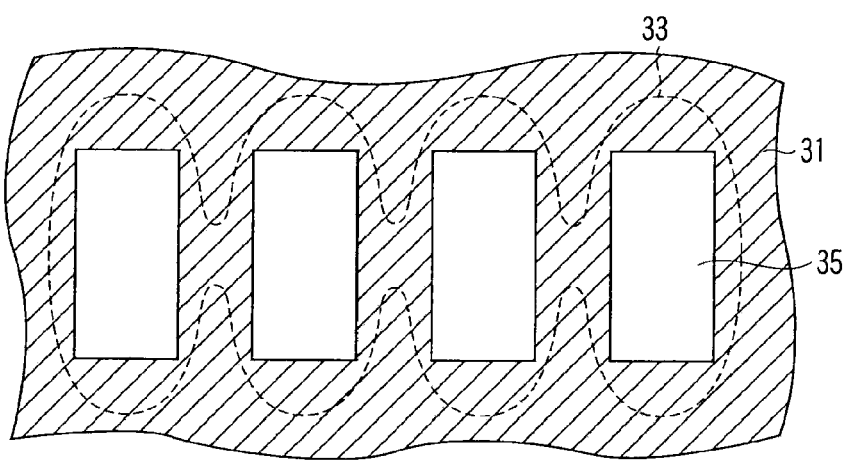

A mask used for exposure is such that rectangular openings 35 are arranged in one direction as shown in FIG. 6C. When exposure is made using such a mask, the light exposure is greater in the central part than at the corners of the pattern, with the result that adjacent openings are connected in such a manner that the connection between them is constricted in the middle. To connect adjacent openings reliably, microscopic auxiliary patterns (SRAF) less than the resolution limit may be provided between adjacent openings.

Next, as shown in FIGS. 19A and 19B, with the resist film 23 as a mask, the mask thin film 22 is selectively etched by RIE techniques. As a result, not only are pattern openings corresponding to the contact patterns made in the mask thin film 22, but also connection openings are made in such a manner that the connection between adjacent pattern openings is constricted in the middle.

Then, as shown in FIGS. 20A and 20B, on the sidewalls of the openings in the mask thin film 22, for example, a spacer film 25 made of, for example, TEOS, SiN, BSG, or polycrystalline Si, is formed. Specifically, after a spacer film 25 is formed on the mask thin film 22 and in the openings by CVD techniques or the like, the entire surface of the spacer film 25 is etched by RIE techniques or the like until the surface of the mask thin film 22 is exposed. As a result, the spacer 25 remains only on the sidewall of the mask thin film 22. The formation of the spacer film 25 not only makes the diameter of the pattern openings smaller but also separates the adjacent pattern openings.

In this case, as a result of the formation of the spacer film 25, the connection part between adjacent openings has to be completely filled with the spacer film 25, thereby separating the adjacent openings. To do this, the film thickness of the spacer film 25 has to be made equal to or larger than S, if the minimum width of the connection part between adjacent openings is 2S.

Next, as shown in FIGS. 21A and 21B, using the mask thin film 22 and spacer film 25 as a mask, the interlayer insulating film 21 is selectively etched by RIE techniques. As a result, microscopic contact holes are made.

As described above, with the fifth embodiment, after the elliptical contact patterns are exposed in a state where the adjacent patterns are connected, the openings in the connection parts are filled by the sidewall leaving technique and the pattern openings are made smaller, which produces the same effect as in the first embodiment.

Specifically, from the comparison with the example of FIG. 1D, it is seen that the following effect is obtained. In the example of FIG. 1D, a space larger than a specific value is needed between contacts to prevent adjacent contacts from short-circuiting. In the fifth embodiment, however, since adjacent contacts are positively short-circuited, the space can be made shorter. Accordingly, the adjacent contacts can be brought still nearer each other, enabling the chip area to be decreased. If the resolution of the exposure device remains unchanged, the chip area can be decreased. If the chip area remains unchanged, an exposure device with a still lower resolution can be used, which enables cost reduction.

The method of using elliptical contacts may be applied not only to the case where the method is used together with the sidewall leaving technique as in the first embodiment but also to the second to fourth embodiments. That is, in each of the embodiments, elliptical patterns linearly arranged may be used as contact patterns instead of zigzag-arranged circular patterns.

Sixth Embodiment

FIGS. 22A and 22B to FIGS. 25A and 25B are diagrams to help explain semiconductor device manufacturing steps according to a sixth embodiment of the invention, particularly contact hole making steps. FIG. 22A to FIG. 25A are plan views and FIG. 22B to FIG. 25B are sectional views taken along line X-X' of FIG. 22A to FIG. 25A. The same parts as those in FIGS. 2A and 2B to FIGS. 5A and 5B are indicated by the same reference numerals and a detailed explanation of them will be omitted.

The sixth embodiment differs from the first embodiment in that circular contacts are arranged linearly instead of arranging circular contacts in a zigzag. Moreover, the sixth embodiment differs from the fifth embodiment in that the shape of contacts is changed from elliptical to circular.

As shown in FIGS. 22A and 22B, the resist film 23 is exposed using circular contact patterns arranged close to one another in a certain direction. At this time, exposure is made so as to short-circuit the corners of adjacent contacts, thereby forming a resist pattern 54 where the adjacent contacts are connected in such a manner that the connection between them is constricted in the middle.

Figure 6D:
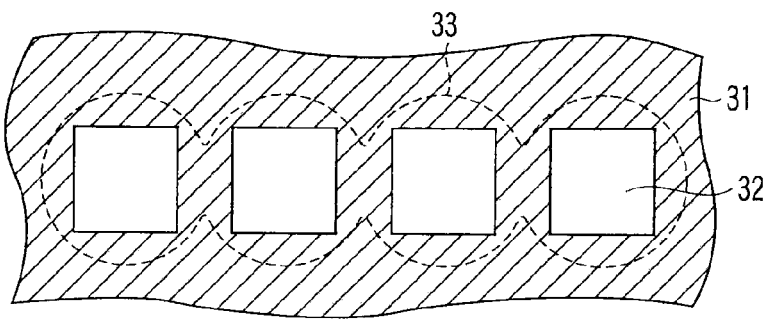

A mask used for exposure is such that rectangular openings 32 are arranged in a direction as shown in FIG. 6D. When exposure is made using such a mask, the light exposure is greater in the central part than at the corners of the pattern, with the result that adjacent openings are connected in such a manner that the connection between them is constricted in the middle. To connect adjacent openings reliably, microscopic auxiliary patterns (SRAF) less than the resolution limit may be provided between adjacent openings.

Next, as shown in FIGS. 23A and 23B, with the resist film 23 as a mask, the mask thin film 22 is selectively etched by RIE techniques. As a result, not only are pattern openings corresponding to the contact patterns made in the mask thin film 22, but also connection openings are made in such a manner that the connection between adjacent pattern openings is constricted in the middle.

Then, as shown in FIGS. 24A and 24B, on the sidewalls of the openings in the mask thin film 22, a spacer film 25 made of, for example, TEOS, SiN, BSG, or polycrystalline Si, is formed. Specifically, after a spacer film 25 is formed on the mask thin film 22 and in the openings by CVD techniques or the like, the entire surface of the spacer film 25 is etched by RIE techniques until the surface of the mask thin film 22 is exposed. As a result, the spacer film 25 remains only on the sidewall of the mask thin film 22. The formation of the spacer film 25 not only makes the diameter of the pattern openings smaller but also separates the adjacent pattern openings.

In this case, as a result of the formation of the spacer film 25, the connection part between adjacent openings has to be completely filled with the spacer film 25, thereby separating the adjacent openings. To do this, the film thickness of the spacer film 25 has to be made equal to or larger than S, if the minimum width of the connection part between adjacent openings is 2S.

Next, as shown in FIGS. 25A and 25B, using the mask thin film 22 and spacer film 25 as a mask, the interlayer insulating film 21 is selectively etched by RIE techniques. As a result, microscopic contact holes are made.

As described above, with the sixth embodiment, after the circular contact patterns are exposed in a state where the adjacent patterns are connected, the openings in the connection parts are filled by the sidewall leaving technique and the pattern openings are made smaller, which produces the same effect as in the first embodiment.

Specifically, from the comparison with the example of FIG. 1B, it is seen that the following effect is obtained. In the example of FIG. 1B, if contacts whose diameter is larger than F are arranged with a pitch of 2F, the adjacent space becomes smaller than F, permitting adjacent short circuits to occur. Therefore, it has been said that patterns cannot be formed. In contrast, with the sixth embodiment, since adjacent short circuits are allowed, even if contacts are arranged as shown in FIG. 1B, contact patterns can be formed. Accordingly, using a not-so-high resolution exposure device, the same contact patterns can be formed as when a high resolution exposure device is used, which makes it possible to reduce the pattern forming cost. Moreover, in the sixth embodiment, the chip area can be reduced more than when zigzag-arranged patterns are used or when elliptical contacts are used.

The method of using circular contacts may be applied not only to the case where the method is used together with the sidewall leaving technique, as in the first embodiment, but also to the second to fourth embodiments. That is, in each of the embodiments, circular patterns linearly arranged may be used as contact patterns instead of zigzag-arranged circular patterns.

MODIFICATIONS

This invention is not limited to the above embodiments. In the embodiments, all of the contacts have been arranged periodically. However, all the contacts are not necessarily arranged periodically and may be arranged in another way, provided that a part of the contacts are arranged close to one another.

Figure 26A:
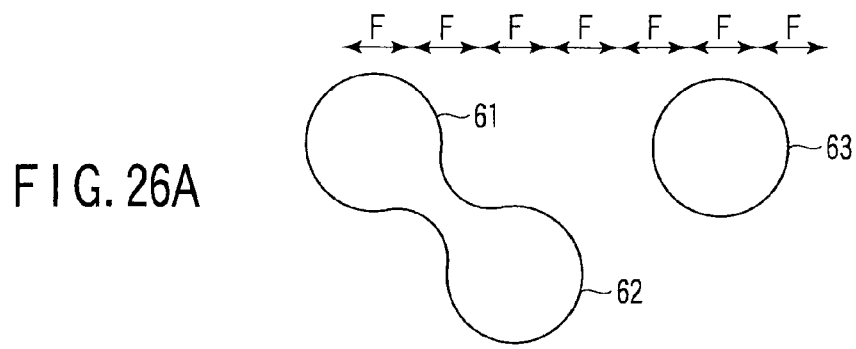
FIGS. 26A to 26D are plan views to help explain modifications of the invention.
Figure 26B:
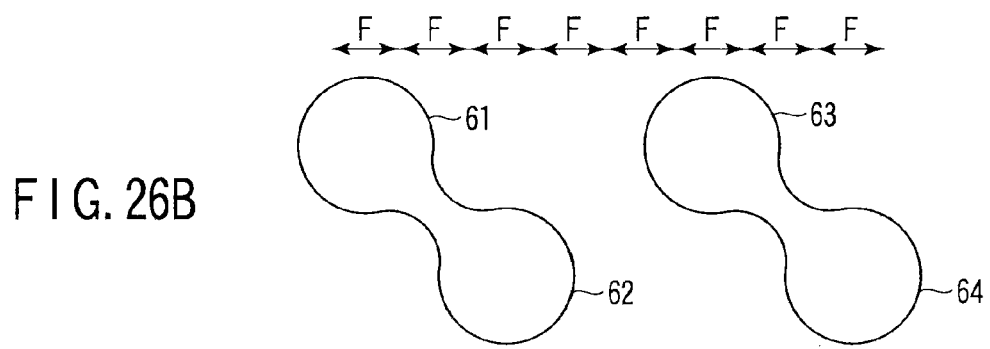

For example, as shown in FIG. 26A, patterns may be such that circular contacts 61, 62 are arranged close to each other and a circular contact 63 is arranged away from them. Moreover, as shown in FIG. 26B, patterns may be such that contacts 61, 62 are arranged close to each other, and contact 63, 64 are arranged close to each other, and the contacts 63, 64 are sufficiently away from the contacts 63, 64.

Figure 26C:
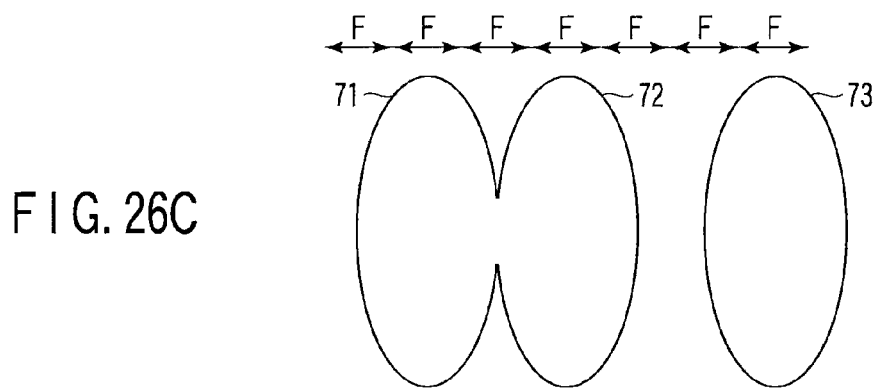
Figure 26D:
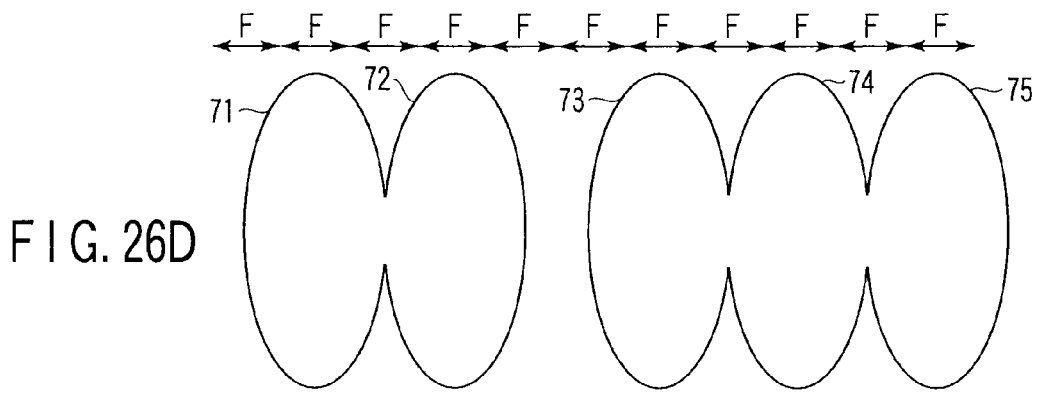

Furthermore, as shown in FIG. 26C, patterns may be such that elliptical contacts 71, 72 are arranged close to each other and an elliptical contact 73 is arranged away from them. Moreover, as shown in FIG. 26D, patterns may be such that contacts 71, 72 are arranged close to each other, and contact 73, 74, 75 are arranged close to one another, and the contacts 71, 72 are sufficiently away from the contacts 73, 74, 75. The point is that patterns have to be such that at least a part of the contacts are arranged close to one another.

In addition, the material for the mask thin film is not limited to a nitride film. Various kinds of materials explained in the embodiments may be used. Moreover, not only those materials but also other materials may be used, provided that selective etching can be performed with a resist as a mask and a sufficient etching selection ratio can be secured with respect to a film to be processed. Furthermore, the materials for the spacer film and resist auxiliary film may be changed suitably according to the specification.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   forming a mask thin film on a film to be processed;
   forming a resist film on the mask thin film;
   exposing the resist film, thereby forming a resist pattern where adjacent hole patterns are connected in such a manner that the connection between them is constricted in the middle;
   selectively etching the mask thin film with the resist pattern as a mask, thereby making first openings each including a constriction in the mask thin film;
   forming a spacer film on the sidewalls of the first openings in the mask thin film, and narrowing the diameter of the first openings, thereby forming a plurality of second openings in the mask thin film; and
   selectively etching the film to be processed with the mask thin film and spacer film as a mask, thereby making holes.

2. The semiconductor device manufacturing method according to claim 1, wherein the exposing the resist film includes using an exposure mask in which rectangular openings have been arranged periodically and transcribing the pattern of the mask onto the resist film with an exposure device.

3. The semiconductor device manufacturing method according to claim 1, wherein the exposing the resist film includes using an exposure mask in which rectangular openings have been arranged periodically and microscopic auxiliary patterns less than a resolution limit have been arranged between adjacent rectangular openings and transcribing the pattern of the mask onto the resist film with an exposure device.

4. The semiconductor device manufacturing method according to claim 1, wherein the plurality of second openings are surrounded by the sidewall film.

5. The semiconductor device manufacturing method according to claim 1, wherein the thickness of the sidewall film is equal to at least ½ the minimum width of the first opening.

6. The semiconductor device manufacturing method according to claim 1, wherein the holes are arranged in a zigzag or linearly.

7. The semiconductor device manufacturing method according to claim 1, wherein the holes are formed circularly or elliptically.

8. The semiconductor device manufacturing method according to claim 1, wherein the diameter of the openings is made smaller by forming an auxiliary resist film on the sidewalls of the openings in the resist pattern before selectively etching the mask thin film with the resist pattern as a mask.

9. A semiconductor device manufacturing method comprising:
   forming a mask thin film on a film to be processed;
   forming a resist film on the mask thin film;
   exposing the resist film, thereby forming a resist pattern having first openings, where adjacent hole patterns are connected in such a manner that the connection between them is constricted in the middle;
   forming an auxiliary resist film on the sidewalls of the first openings, and narrowing the diameter of the first openings, thereby forming a plurality of second openings in the resist film;
   selectively etching the mask thin film using the resist film and auxiliary resist film as a mask; and
   making holes by selectively etching the film to be processed using the mask thin film as a mask.

10. The semiconductor device manufacturing method according to claim 9, wherein the exposing the resist film includes using an exposure mask in which rectangular openings have been arranged periodically and transcribing the pattern of the mask onto the resist film with an exposure device.

11. The semiconductor device manufacturing method according to claim 9, wherein the exposing the resist film includes using an exposure mask in which rectangular openings have been arranged periodically and microscopic auxiliary patterns less than a resolution limit have been arranged between adjacent rectangular openings and transcribing the pattern of the mask onto the resist film with an exposure device.

12. The semiconductor device manufacturing method according to claim 9, wherein the plurality of second openings are surrounded by the sidewall film.

13. The semiconductor device manufacturing method according to claim 9, wherein the thickness of the sidewall film is equal to at least ½ the minimum width of the first opening.

14. The semiconductor device manufacturing method according to claim 9, wherein the holes are arranged in a zigzag or linearly.

15. The semiconductor device manufacturing method according to claim 9, wherein the holes are formed circularly or elliptically.

16. The semiconductor device manufacturing method according to claim 9, wherein the surface of the resist film is coated with a processing auxiliary material, the resulting resist film is heat treated, and acid in the resist film is diffused to cause the resist film to cross-linking react with the processing auxiliary material, whereby a thermoset resist auxiliary film is formed on the inside of the first openings to separate the first openings.

* * * * *